(12) United States Patent
Cheng et al.

(10) Patent No.: US 10,504,890 B2
(45) Date of Patent: Dec. 10, 2019

(54) HIGH DENSITY NANOSHEET DIODES

(71) Applicant: International Business Machines Corporation, Armonk, NY (US)

(72) Inventors: Kangguo Cheng, Schenectady, NY (US); Juntao Li, Cohoes, NY (US); Geng Wang, Stormville, NY (US); Qintao Zhang, Mt Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/805,670

(22) Filed: Nov. 7, 2017

(65) Prior Publication Data

US 2018/0102359 A1     Apr. 12, 2018

Related U.S. Application Data

(62) Division of application No. 15/289,390, filed on Oct. 10, 2016, now Pat. No. 9,842,835.

(51) Int. Cl.
*H01L 27/06* (2006.01)
*H01L 27/12* (2006.01)
(Continued)

(52) U.S. Cl.
CPC ...... *H01L 27/0629* (2013.01); *H01L 21/8249* (2013.01); *H01L 27/1203* (2013.01); *H01L 29/0657* (2013.01); *H01L 29/0673* (2013.01); *H01L 29/157* (2013.01); *H01L 29/42392* (2013.01); *H01L 29/66136* (2013.01); *H01L 29/66439* (2013.01); *H01L 29/66742* (2013.01); *H01L 29/775* (2013.01); *H01L 29/78618* (2013.01); *H01L 29/78654* (2013.01);
(Continued)

(58) Field of Classification Search
CPC ......... H01L 29/66121; H01L 29/66136; H01L 27/0629
See application file for complete search history.

(56) References Cited

U.S. PATENT DOCUMENTS

| 5,111,253 A | 5/1992 | Korman et al. |
| 6,097,046 A | 8/2000 | Plumton |

(Continued)

OTHER PUBLICATIONS

List of IBM Patents or Patent Applications Treated as Related; (Appendix P), Filed Nov. 7, 2017; 2 pages.
(Continued)

*Primary Examiner* — Meiya Li
*Assistant Examiner* — Peter M Albrecht
(74) *Attorney, Agent, or Firm* — Cantour Colburn LLP; Vazken Alexanian (57) ABSTRACT

Embodiments are directed to a method for forming a semiconductor structure by depositing a stack of alternating layers of two materials over a substrate and defining field-effect transistor (FET) and diode regions. The method further includes depositing a mask, where the mask covers only the FET region while leaving the diode region uncovered. The method further includes doping the material in the diode region with a dopant, implanting epitaxial material with another dopant to form PN junctions, stripping the mask from the structure, forming a metal gate conductor over the FET region, and depositing a metal over the substrate to create terminals.

9 Claims, 7 Drawing Sheets

(51) Int. Cl.

| | |
|---|---|
| *H01L 29/06* | (2006.01) |
| *H01L 29/66* | (2006.01) |
| *H01L 29/423* | (2006.01) |
| *H01L 29/786* | (2006.01) |
| *H01L 29/861* | (2006.01) |
| *H01L 21/8249* | (2006.01) |
| *H01L 29/775* | (2006.01) |
| *H01L 29/15* | (2006.01) |
| *H01L 21/84* | (2006.01) |

(52) U.S. Cl.
CPC ...... *H01L 29/78696* (2013.01); *H01L 29/861* (2013.01); *H01L 29/8613* (2013.01); *H01L 21/84* (2013.01); *H01L 29/66545* (2013.01)

(56) References Cited

U.S. PATENT DOCUMENTS

| | | |
|---|---|---|
| 7,504,673 B2 | 3/2009 | Sadaka et al. |
| 7,564,074 B2 | 7/2009 | Sadaka et al. |
| 7,642,568 B2 | 1/2010 | Brar et al. |
| 7,655,963 B2 | 2/2010 | Sadaka et al. |
| 8,482,078 B2 * | 7/2013 | Cheng ............ H01L 21/823418 257/369 |
| 8,592,904 B2 | 11/2013 | Shiraishi et al. |
| 9,059,014 B2 | 6/2015 | Cheng et al. |
| 9,246,410 B2 | 1/2016 | Hirler et al. |
| 9,257,547 B2 | 2/2016 | Fichtenbaum et al. |
| 9,281,388 B2 | 3/2016 | Briere |
| 9,362,355 B1 | 6/2016 | Cheng et al. |
| 2005/0266645 A1 | 12/2005 | Park |
| 2006/0284218 A1 | 12/2006 | Kaner et al. |
| 2008/0050573 A1 | 2/2008 | Nakano et al. |
| 2012/0305893 A1 | 12/2012 | Colinge |
| 2013/0285208 A1 | 10/2013 | Standaert et al. |
| 2013/0336033 A1 | 12/2013 | Hirler et al. |
| 2014/0117490 A1 * | 5/2014 | Yamashita .......... H01L 27/0255 257/506 |
| 2014/0217502 A1 * | 8/2014 | Chang ............... H01L 29/66477 257/347 |
| 2014/0217507 A1 | 8/2014 | Chang et al. |
| 2015/0123215 A1 | 5/2015 | Obradovic et al. |
| 2015/0295084 A1 | 10/2015 | Obradovic et al. |
| 2015/0364546 A1 * | 12/2015 | Rodder ............... H01L 29/1037 257/9 |
| 2016/0071970 A1 | 3/2016 | Hatcher et al. |
| 2018/0097060 A1 * | 4/2018 | Zhou ................ H01L 21/02164 |

OTHER PUBLICATIONS

Kangguo Cheng, et al., "High Density Nanosheet Diodes", U.S. Appl. No. 15/289,390, filed Oct. 10, 2016.

\* cited by examiner

FIG. 9

HIGH DENSITY NANOSHEET DIODES

DOMESTIC PRIORITY

This application is a division of U.S. application Ser. No. 15/289,390 filed Oct. 10, 2016, the disclosure of which is incorporated herein by reference in its entirety.

BACKGROUND

The present invention generally relates to complementary metal-oxide-semiconductor (CMOS) fabrication methods and related structures. More specifically, the present invention relates to methods and device architectures for fabricating diodes and transistors that can be integrated with nanosheet CMOS structures, thus allowing the formation of on-chip diodes with increased junction areas at the same time as forming nanosheet transistors.

In contemporary semiconductor device fabrication processes, a large number of devices, including field effect transistors (FETs), are fabricated on a single wafer. In addition to these devices, there is a need for other structures, such as diodes, that are formed from PN junctions. Being fabricated from similar materials, it is advantageous to be able to form both FETs and diodes onto a substrate by applying the same processes onto the same structure and on the same layer, including nanosheet layers. In nanosheet-based transistors (or nanowire-based transistors), in contrast to conventional FETs, the gate stack wraps around the full perimeter of each nanosheet (or nanowire), enabling fuller depletion in the channel region, and reducing short-channel effects due to steeper sub-threshold swing (SS) and smaller drain-induced barrier lowering (DIBL). Diodes fabricated from nanosheet structures also increase the PN junction area per footprint.

SUMMARY

Embodiments are directed to a method for forming a semiconductor structure, the method including forming a stack of alternating layers of first and second materials over a substrate, where a FET region and a diode region with a source, drain, and channel region defined. The method further includes depositing a mask over the structure, with the mask covering the FET region while leaving the diode region uncovered, and doping the second material in the diode region with a first dopant. The method further includes implanting epitaxial material with a second dopant to form PN junctions in the diode region. Next, the method includes forming a high-k/metal gate conductor over the FET region. The method further includes forming a metalizing contact material over the substrate to create terminals for both the FET and diode regions.

Embodiments are also directed to a semiconductor device with a substrate and a stack of alternating layers of a first and second material over the device. The device further includes a FET and diode region, gate, source, and drain regions, and a channel region. The device includes a spacer that isolates the gate from the source and drain regions, a doped second material in the diode region, epitaxial material with a second dopant that forms a PN junction in the diode region, a high-k/metal gate conductor over the FET region, and a metalizing contact material that are formed into terminals.

BRIEF DESCRIPTION OF THE DRAWINGS

The subject matter of embodiments of the present invention are particularly pointed out and distinctly defined in the claims at the conclusion of the specification. The foregoing and other features and advantages are apparent from the following detailed description taken in conjunction with the accompanying drawings in which:

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on," or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication can be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The MOSFET (metal-oxide-semiconductor field effect transistor) is a transistor used for amplifying or switching electronic signals. The MOSFET has source, drain, and metal oxide gate junctions or electrodes. The metal gate is electrically insulated from the main semiconductor n-channel or p-channel by a thin layer of insulating material, for example, silicon dioxide or a high-k gate dielectric, which makes the input resistance of the MOSFET relatively high. The gate voltage controls whether the path from the drain to the source is an open circuit ("off") or a resistive path ("on"). n-type field effect transistors (NFET) and p-type field effect transistors (PFET) are two types of CMOS (complementary metal-oxide-semiconductor) devices. The NFET uses electrons as the current carriers and with n-type doped source and drain junctions. The PFET uses holes as the current carriers and with p-type doped source and drain junctions. A gate-all-around (GAA) nanosheet transistor, a specific form of a MOSFET device, is a three-dimensional transistor with a gate formed around all four sides of alternating layers of nanosheets, as well as the surface perpendicular to all four sides. The formation of a replacement-gate GAA nanosheet transistor generally involves the formation of a dummy gate used for source and drain formation, followed by removal of the dummy gate, and replacement with a gate dielectric and gate conductor. Semiconductor materials can be doped with either n-type dopants or p-type dopants.

Turning now to an overview of aspects of the present invention, the described methods employ the simultaneous fabrication of both FET and diode devices with nanosheet layers. Some embodiments provide methods of fabricating semiconductor devices, including nanosheet-based devices, FET transistors, and diodes. In addition, one or more embodiments of the present invention can apply to nanowire-based structures. NFET device junctions, including the source and drain, are doped with n-type dopants and for PFET devices, the source and drain are doped with p-type dopants. Embodiments of the described methods employ a nanosheet-based PN diode that is integrated with nanosheet CMOS devices, including FET transistors, beyond the 7 nm range. The diode includes doped P and N junctions, including multiple layers in a nanosheet configuration. The FET transistor is formed using the same process flow, including identical epitaxy, as employed to form the diode device. The PN diode junction region need not be the same width as the FET gate region. In addition, diodes formed using this process can possess a greater PN diode junction area than a planar diode. The fabrication methodologies and resulting structures according to embodiments of the present invention are described in detail below by referring to the accompanying drawings in FIGS. 1-9.

Figure 1:
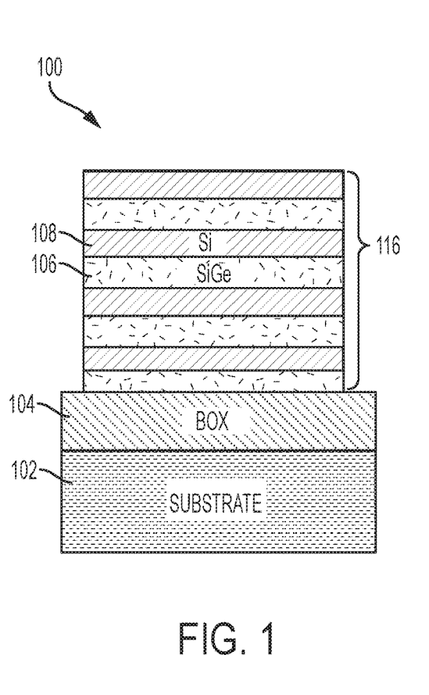
FIG. 1 depicts a cross-sectional view of a semiconductor structure formed with a stack of alternating materials onto the substrate according to embodiments of the present invention.

Turning now to a more detailed description of embodiments of the present invention, FIG. 1 depicts a cross-sectional view of a semiconductor structure 100 formed with a stack of alternating materials onto the substrate according to one or more embodiments of the present invention. Structure 100 includes a semiconductor substrate 102, a buried oxide (BOX) layer 104, and a first material 106 and a second material 108, formed in alternating layers, to make up a stack 116. The second material 108 is also known as a nanosheet. The substrate 102 and BOX layer 104 form a semiconductor-on-insulator (SOI) structure. Alternatively, the substrate 102 is a bulk substrate. The first material 106 of the stack 116 can include silicon germanium (SiGe), while the second material 108 can include silicon (Si). The alternating layers of the stack 116 are nanosheets formed from the first and second materials 106, 108 respectfully. The stack 116 can be formed by wafer bonding and/or epitaxy. Structure 100 can include silicon, germanium, silicon germanium, silicon carbide, or III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions, each greater than or equal to zero, and A1+A2+B1+B2=1 (1 being a total mole quantity). The semiconductor substrate 102 can also include an organic semiconductor or a layered semiconductor such as, for example, Si/SiGe, a silicon-on-insulator, or a SiGe-on-insulator. A portion or the entire semiconductor substrate 102 can be amorphous, polycrystalline, or monocrystalline. In addition to the aforementioned types of semiconductor substrates, the semiconductor substrate 102 employed in embodiments of the present invention can also include a hybrid oriented (HOT) semiconductor substrate 102 in which the HOT substrate has surface regions of different crystallographic orientations. The semiconductor substrate 102 can be doped or undoped, or contain doped regions and undoped regions therein. The semiconductor substrate 102 can contain regions with strain and regions without strain therein, or contain regions of tensile strain and compressive strain.

Figure 2:
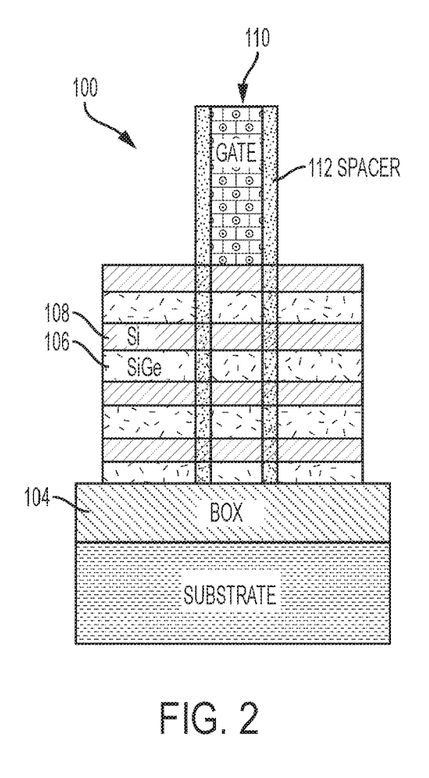
FIG. 2 depicts a cross-sectional view of the semiconductor structure after forming a dummy gate and spacers according to one or more embodiments of the present invention.

FIG. 2 depicts a cross-sectional view of the semiconductor structure 100 after forming a dummy gate and spacers according to one or more embodiments of the present invention. FIG. 2 is a continuation of FIG. 1 and depicts forming a dummy gate 110 surrounded by a spacer 112. The spacer 112 extends downward to the BOX layer 104. The dummy gate 110 can include a dummy gate dielectric (e.g., silicon oxide), amorphous dummy gate, and a gate cap on top of the amorphous silicon. The spacer 112 can include single or multiple dielectric materials, including but not limited to silicon oxide, silicon oxynitride, silicon nitride, SiBCN, SiOCN, SiOC, and SiCN.

Figure 3:
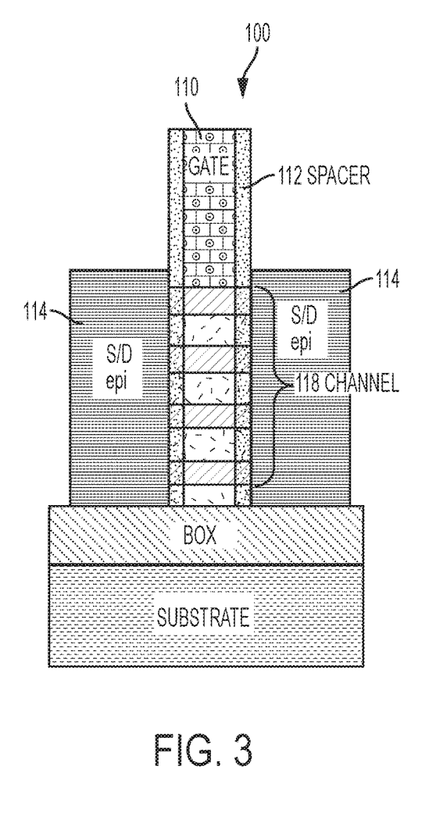
FIG. 3 depicts a cross-sectional view of the structure after forming source, drain, and channel regions on the substrate according to one or more embodiments of the present invention.

FIG. 3 depicts a cross-sectional view of the structure 100 after forming source, drain, and channel regions on the substrate according to one or more embodiments of the present invention. FIG. 3 is a continuation of FIG. 2 and depicts the structure 100 after an epitaxial process is applied to portions of the stack 116 (of FIG. 1) to define source and drain regions 114. The source and drain regions 114 are formed from the stack areas not under the dummy gate 110. The structure 100 also includes a channel region 118, formed between the source and drain regions 114 and within the spacers 112. The channel 118 includes alternating layers of the first material 106 and the second material 108 as described in FIG. 1. In some embodiments, the alternating layers that are not covered by the dummy gate and spacers are recessed before epitaxially growing the source/drain 114. In some embodiments, the SiGe layers are laterally etched and replaced with a dielectric (except SiGe) under the dummy gate 110. In some embodiments, the alternating layers of a first and second material 106, 108, respectfully of FIG. 1 are preserved and epitaxial source/drain regions 114 are grown around the alternating layers in the source/drain regions. The source/drain regions 114 are then doped. Dopants can be incorporated during epitaxy (e.g., by in-situ epitaxy) or by any other suitable doping techniques, including but not limited to, ion implantation, gas phase doping, plasma doping, plasma immersion ion implantation, cluster doping, infusion doping, liquid phase doping, solid phase doping, etc. The epitaxy source/drain can be silicon, silicon germanium, germanium, carbon doped silicon, carbon doped silicon germanium, or any other suitable semiconductor material.

Figure 4:
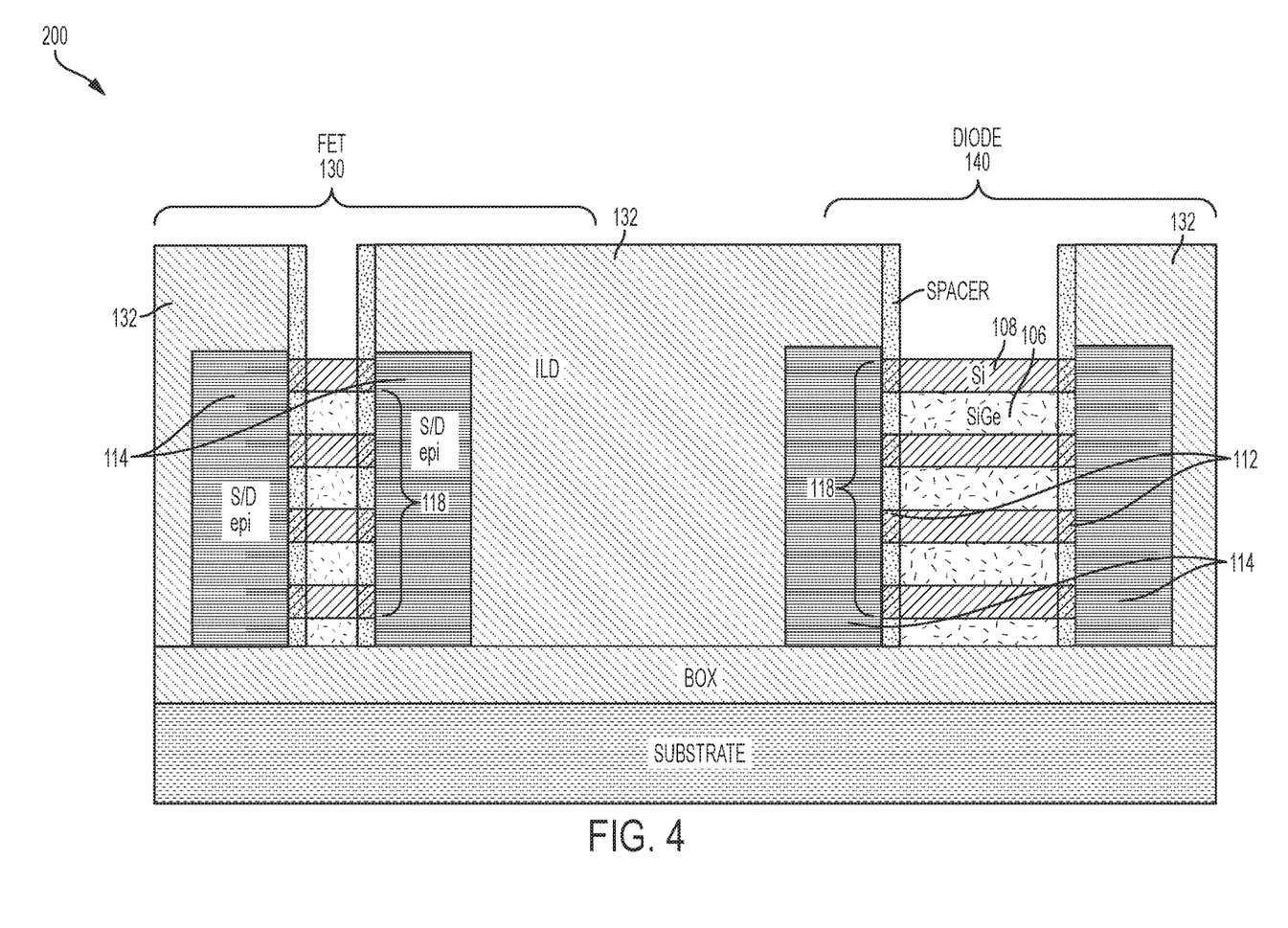
FIG. 4 depicts a cross-sectional view of the structure after depositing an inter-layer dielectric (ILD) onto the substrate and removing the dummy gate according to one or more embodiments of the present invention.

FIG. 4 depicts a cross-sectional view of the structure 200 after depositing an inter-layer dielectric (ILD) onto the substrate and removing the dummy gate according to one or more embodiments of the present invention. FIG. 4 is a continuation of FIG. 3 and depicts the structure 200 at a wider scale than the previous figures and depicts two structures that were formed simultaneously. Embodiments of the present invention include a FET region 130 and a diode region 140, and the regions need not be identical in width. The alternating Si/SiGe layers in the FET region 130 are the same alternating Si/SiGe layers in the diode region 140. For both regions 130, 140, an ILD layer 132 is deposited over the structure 200, covering both regions 130 and 140. The ILD layer 132 can include single or multiple dielectric materials, including but not limited to, silicon oxide, silicon oxynitride, silicon nitride, SiBCN, SiOCN, SiOC, and SiCN. Then, an etching process removes the dummy gate 110 (of FIG. 3) from both regions 130, 140. Now looking at the diode region 140, the region includes spacer 112, source and drain regions 114, and alternating layers of a first material 106 and a second material 108. The first material 106 can include silicon germanium (SiGe), while the second material 108 can include silicon (Si). The diode region 140 is electrically and physically isolated from the FET region 130 by the ILD layer 132. In some embodiments, isolation between regions 130 and 140, such as shallow trench isolation (not shown), can be used to further isolate the FET from the diode. The ILD material 132 is used to electrically separate closely-spaced interconnect lines arranged in several levels (multilevel metallization) in an advanced integrated circuit. It is noteworthy that both regions 130, 140 are formed at the same time and employing the same processes and do not require specialized steps to produce the different regions.

Figure 5:
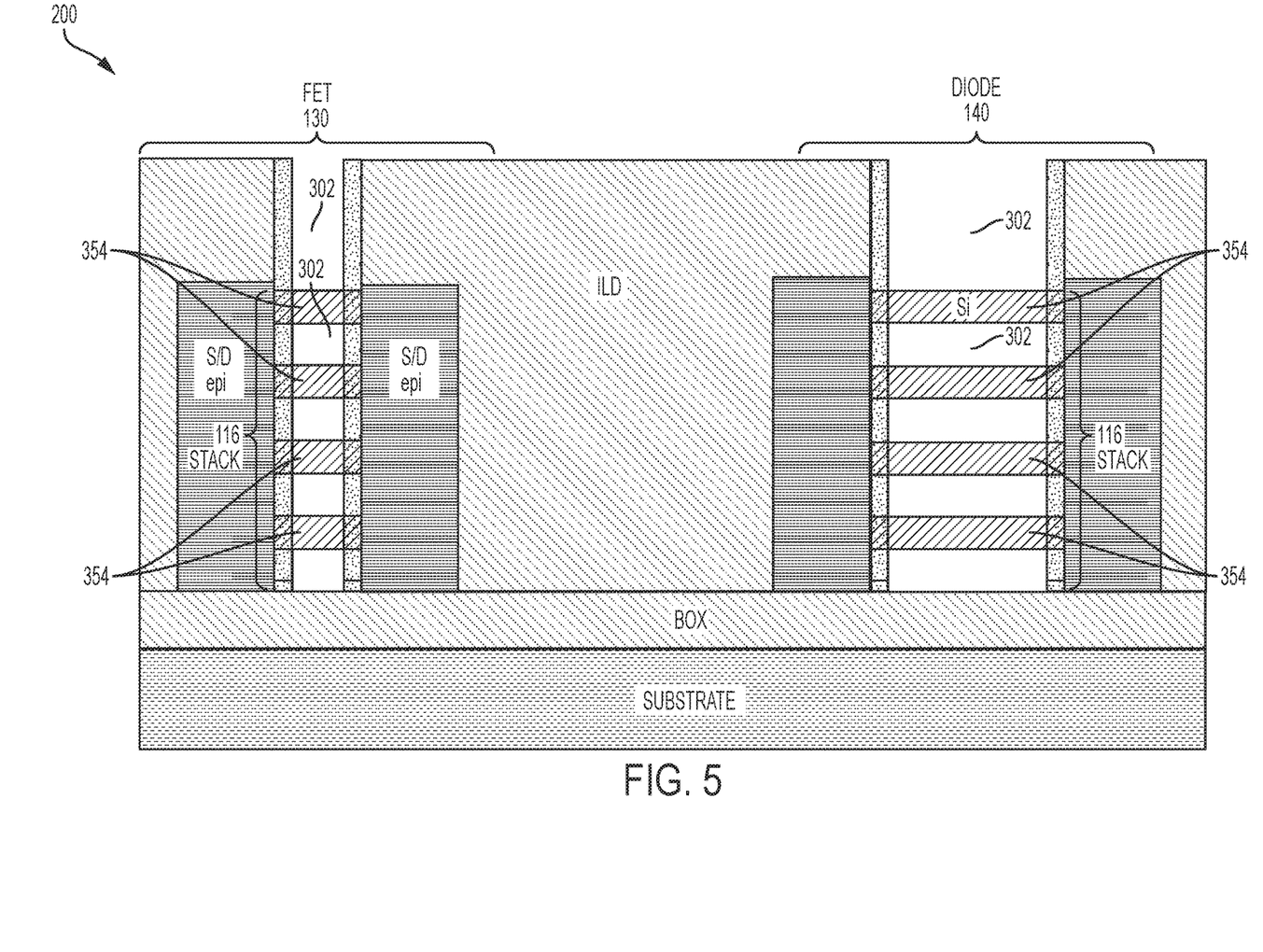
FIG. 5 depicts a cross-sectional view of the structure after removing selected SiGe layers of the structure, according to one or more embodiments of the present invention.

FIG. 5 depicts a cross-sectional view of the structure 200 after removing selected SiGe layers of the structure according to one or more embodiments of the present invention. FIG. 5 is a continuation of FIG. 4 and includes removing selective layers of the first material (SiGe) 106 (of FIG. 4) from the stack 116 to create gaps 302 in the FET and diode regions 130, 140 respectively. Two methods to remove layers of the first material 106 (of FIG. 4) include gas phase hydrofluoric acid (HCl) and a wet etch process with an etchant containing ammonia and hydrogen peroxide. Left behind during the etching process is the second material 108 (of FIG. 4), also referred to as nanosheet 354. This process removes the first material 106 (of FIG. 4) while retaining the source and drain regions 114 (of FIG. 4) and the layers of the nanosheet 354 in both the FET and diode regions 130, 140.

Figure 6:
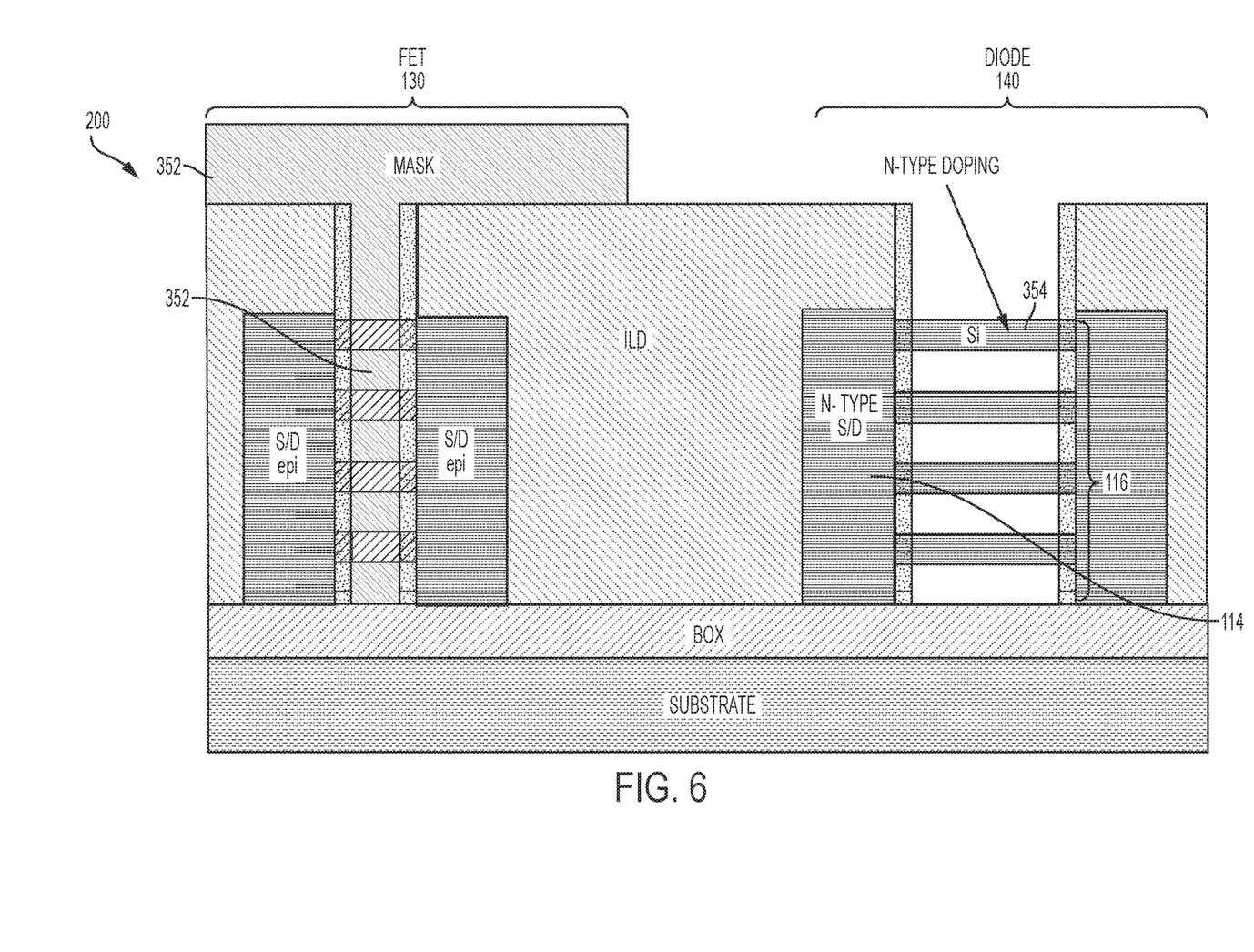
FIG. 6 depicts a cross-sectional view of the structure after forming a mask and doping the nanosheets in the diode region according to one or more embodiments of the present invention.

Continuing with the process of forming a semiconductor structure, FIG. 6 depicts a cross-sectional view of the structure 200 after forming a mask and doping the nanosheets 354 (of FIG. 5) in the diode region 140 according to one or more embodiments of the present invention. FIG. 6 is a continuation of FIG. 5 and includes depositing and patterning a mask 352 over predetermined areas of the substrate, to include the FET region 130 but excluding the diode region 140. The mask 352 can include, but is not limited to, an amorphous carbon. The mask 352 is also formed in the gaps 302 (of FIG. 5) found in the FET region 130 to form layers of the mask 352 inside the stack 116 (of FIG. 5) in the FET region 130. Then, a doping process is carried out where the nanosheets 354 in diode region 140 is doped with a dopant that has the same doping polarity as the source/drain 114. For example, if the source/drain 114 has n-type dopants, the nanosheets 354 are doped with n-type dopants. If the source/drain 114 has p-type dopants, the nanosheets 354 are doped with p-type dopants. Doping techniques include, but are not limited to, ion implantation, gas phase doping, plasma doping, plasma immersion ion implantation, cluster doping, infusion doping, liquid phase doping, solid phase doping, etc. A thermal anneal process such as laser anneal, flash anneal, rapid thermal anneal (RTA), furnace anneal, or any suitable combination of those annealing techniques can be performed.

Figure 7:
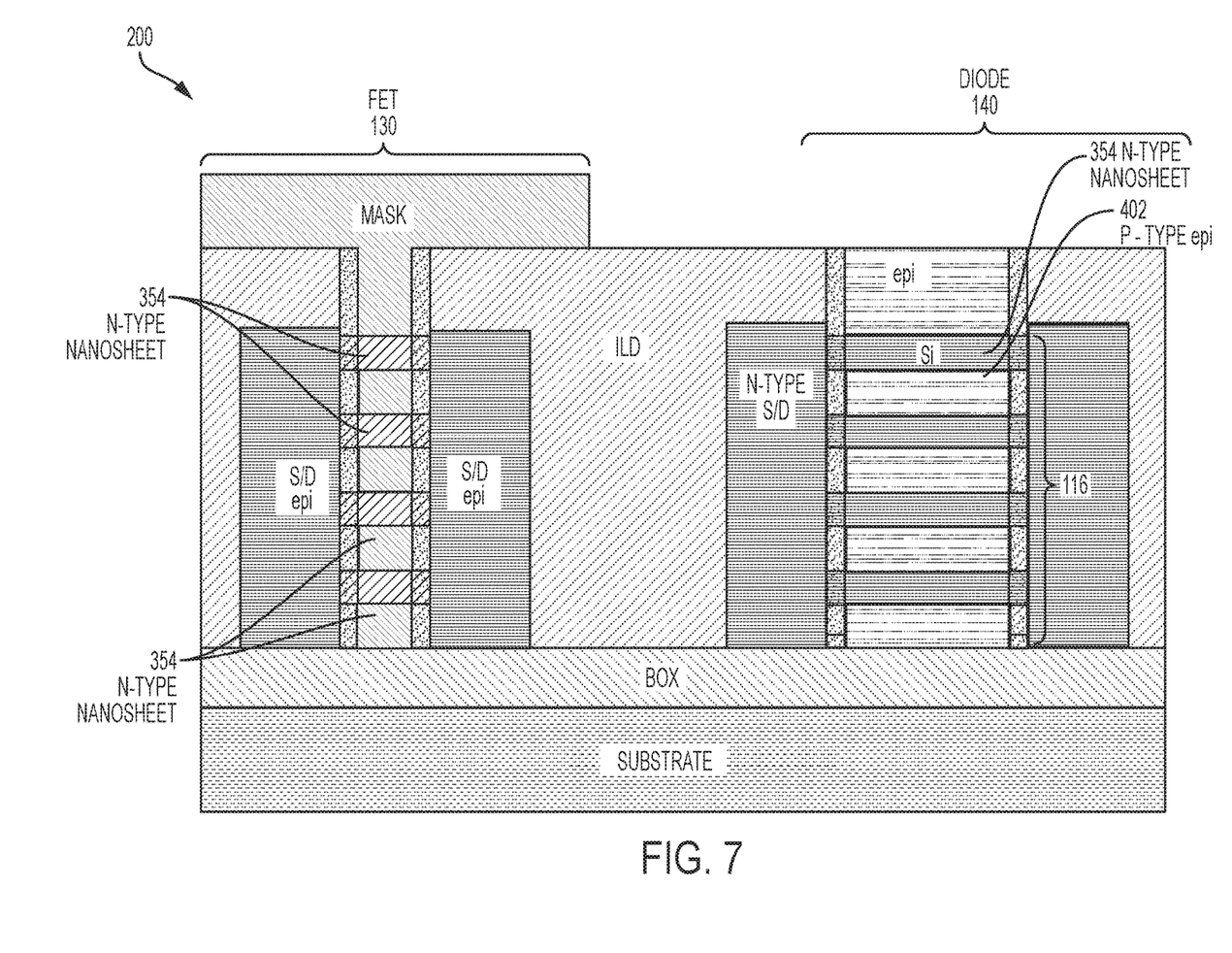
FIG. 7 depicts a cross-sectional view of the structure after epitaxially growing materials around the nanosheets to form PN diode junctions according to one or more embodiments of the present invention.

FIG. 7 is a continuation of FIG. 6 and depicts a cross-sectional view of the structure 200 after epitaxially depositing a material that has dopants with a doping polarity opposite to the doping polarity of the nanosheet and the source/drain to form PN diode junctions. For example, if the nanosheets 354 and source/drain 114 (of FIG. 4) have n-type dopants, epitaxial material 402 has p-type dopants. Conversely, if the nanosheet 354 and the source/drain 114 (of FIG. 4) contain p-type dopants, the epitaxial material 402 has n-type dopants. Doping concentrations can be tuned to meet the diode fabrication and design requirements. Non-limiting doping concentrations in the source/drain 114 (of FIG. 4) include, but are not limited to 5E19 $cm^{-3}$ to 2E21 $cm^{-3}$. Non-limiting doping concentrations in the nanosheets 354 include, but are not limited to 2E18 $cm^{-3}$ to 2E21 $cm^{-3}$. Non-limiting doping concentrations in the epitaxial material 402 include, but are not limited to 2E18 $cm^{-3}$ to 2E21 $cm^{-3}$. The doping concentrations can be uniform or can possess a suitable gradient. The epitaxial material 402 can include silicon, silicon germanium, germanium, carbon-doped silicon, carbon-doped silicon germanium, etc. The epitaxial material 402 and the nanosheets 354 form a PN diode according to one or more embodiments of the present invention. In another embodiment, the process of applying p-type and then n-type dopants to the nanosheets 354 and the gaps 302 (of FIG. 5) respectfully can be reversed, thus n-type and p-type materials can be formed, with the resultant PN junctions formed as before, but with a reversed polarity as compared to embodiments of the present invention. N-type dopants are selected from the group of phosphorus (P), arsenic (As), and antimony (Sb), and a p-type dopant is selected from the group of boron (B), boron fluoride (BF2), gallium (Ga), indium (In), and thallium (Tl). The three process steps of (1) selectively removing SiGe, (2) doping the Si nanosheet 354, and (3) epitaxially growing material around the nanosheet 354, can be performed with separate processes. In some embodiments of the present invention, some processes can be integrated together. For example, all 3 steps can be done in an epitaxy chamber by flowing HCl gas to remove SiGe, flowing doping species to dope the nanosheets 354, and conducting in-situ doped epitaxy to form the material wrapping around the nanosheets 354. In some embodiments, steps (1) and (2) are performed in the same chamber while step (3) is performed separately. In other embodiments, steps (2) and (3) are combined while step (1) is performed separately.

Figure 8:
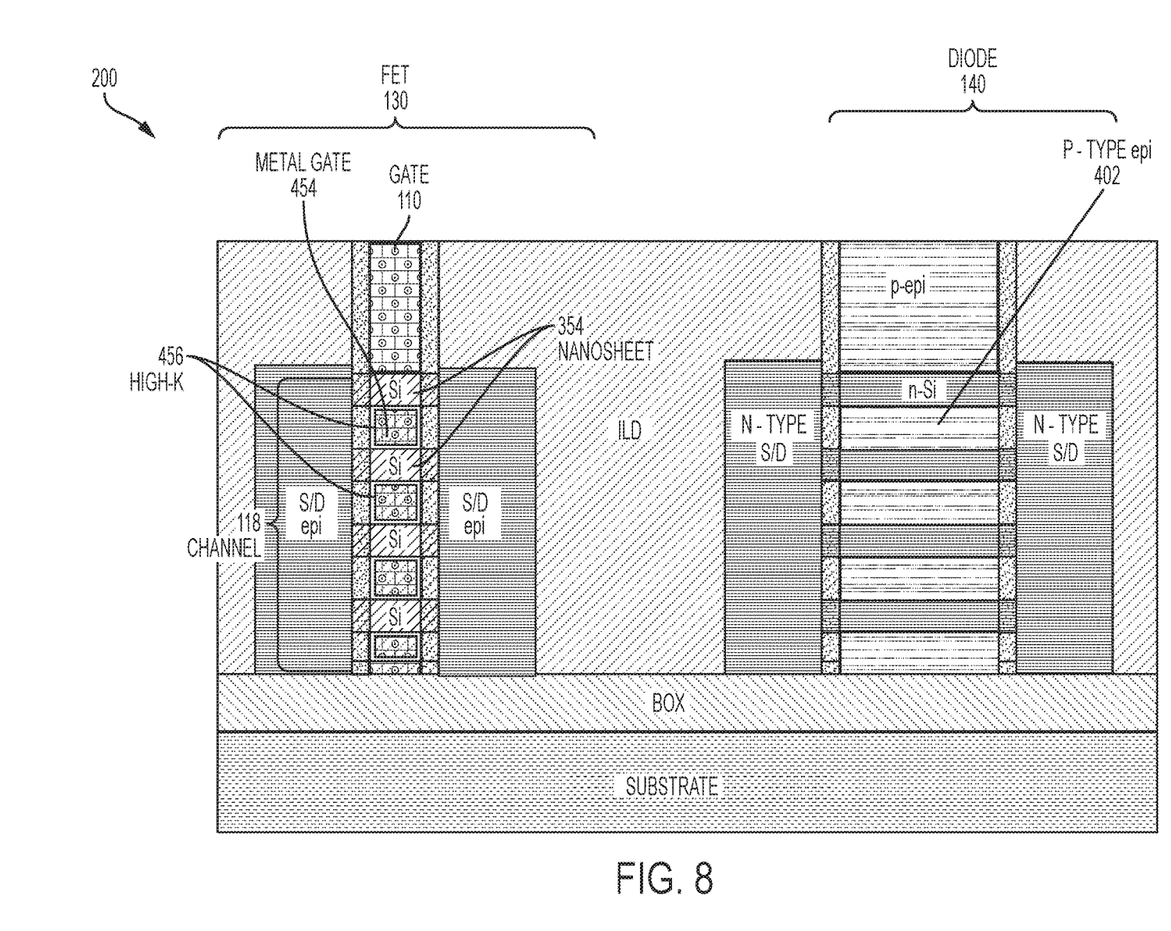
FIG. 8 depicts a cross-sectional view of the structure after stripping the mask and forming a gate and channel according to one or more embodiments of the present invention.

FIG. 8, which is a continuation of FIG. 7, depicts a cross-sectional view of the structure 200 after stripping the mask 352 (of FIG. 6) off of the structure and forming a gate and channel in the FET region according to one or more embodiments of the present invention. In the FET region 130, layers of nanosheets 354 are located underneath the gate 110. In one or more embodiments, the channel region 118 includes a metal gate conductor 454 and a high-k gate dielectric 456, where the high-k gate dielectric 456 surrounds the metal gate conductor 454 and electrically isolates it from the surrounding structure. Due to the multiple layers of nanosheets 354 present, multiple metal gate conductors 454 are present in the structure. The high-k gate dielectric 456 can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as lanthanum and aluminum. The gate conductor material can include doped polycrystalline or amorphous silicon, germanium, silicon germanium, a metal (e.g., tungsten, titanium, tantalum, ruthenium, zirconium, cobalt, copper, aluminum, lead, platinum, tin, silver, or gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, or nickel silicide), carbon nanotube, conductive carbon, graphene, or any suitable combination of these materials. The conductive material can further include dopants that are incorporated during or after deposition. The gate can further include a work function setting layer. The work function layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Figure 9:
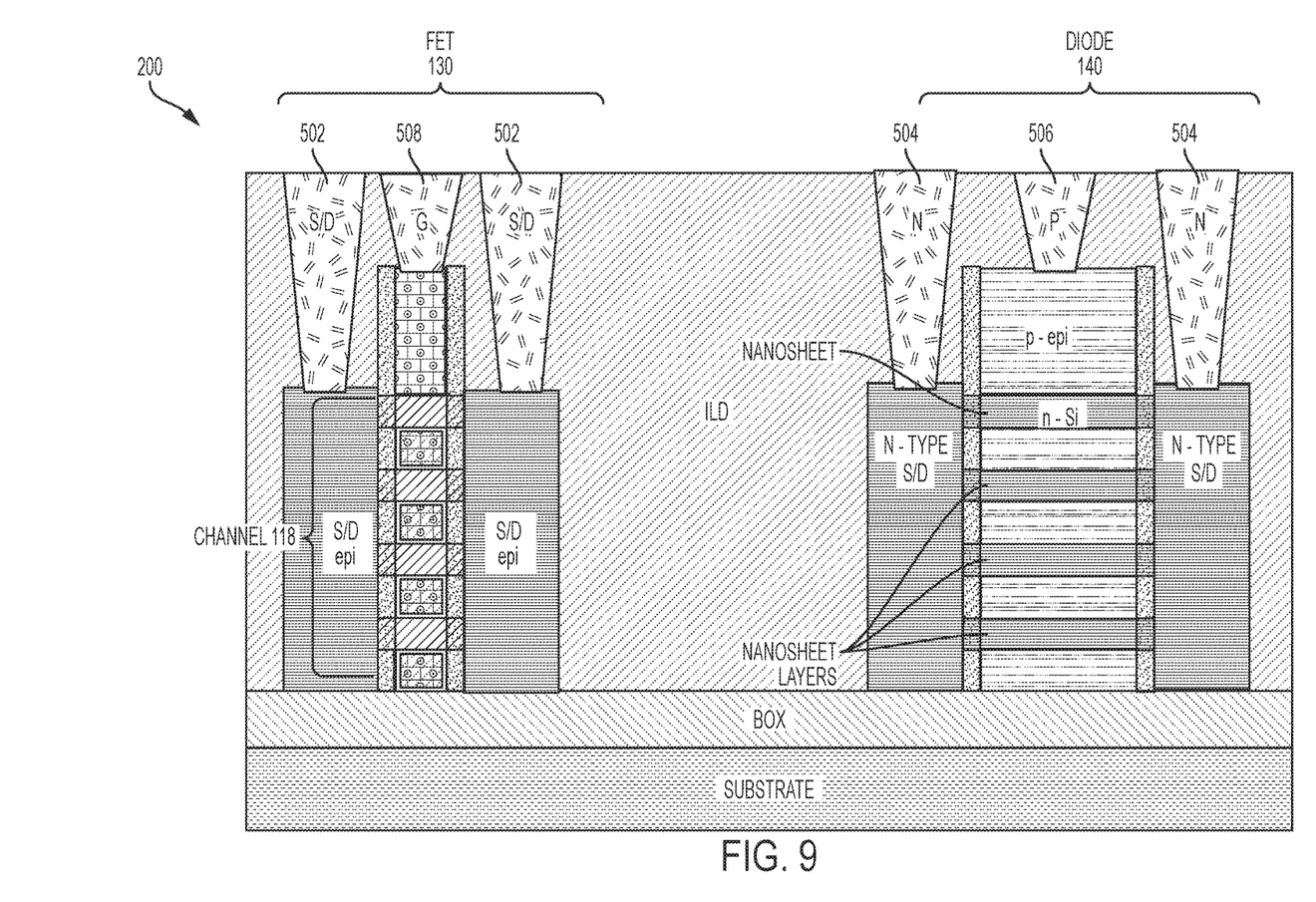
FIG. 9 depicts a cross-sectional view of the structure after depositing a contact layer on the substrate according to one or more embodiments of the present invention.

FIG. 9, which is a continuation of FIG. 8, depicts a cross-sectional view of the structure 200 after depositing a contact layer on the substrate according to one or more embodiments of the present invention. Non-limiting methods for forming contacts include depositing a dielectric material, patterning to form contact trenches, and filling the trenches with a conducting material. FIG. 9 depicts forming FET region 130 source/drain contacts 502 and a gate contact 508. The FET source/drain contacts 502 extend downward from the surface of the structure 200 to the source and drain regions 114 (of FIG. 4). The FET gate contact 508 extends downward from the surface of the structure 200 to the channel region 118. The resultant structure 200 also shows an on-chip diode region 140 with two n-contacts 504 and a single p-contact 506. For the diode region 140, the n-contacts 504 are present in multiple examples due to the aforementioned fabrication techniques, but are electrically identical to each other and either n-contact 504 are used to operate the diode 140 without ill effects. The diode 140 has multiple PN junctions due to the multiple layers of n-type and p-type materials present due to nanosheets used in the fabrication process. In the present embodiment, four nanosheet layers are interleaved with the p-type epi material and create eight PN junction areas. The diode 140 includes p-type and n-type layers that creates a PN junction with an area that is 2N times as large as compared to a planar diode device, with N being the number of nanosheets in the structure. The increased PN junction area of the diode 140 aids in resisting electrostatic discharge events over planar diodes. The structure 200 includes at least a FET transistor 130 and a nanosheet diode 140 made with nanosheet layers. Both the FET 130 and the diode 140 are formed at the same time and employ the same processes and do not require specialized steps to produce the different regions. Both devices 130, 140 have identical epitaxy at the ends of the stacked nanosheets and spacers. In the transistor region, the epitaxy serves as the source and drain of the transistor. In the diode region 140, the epitaxy serves as the contact to the nanosheet which is doped with the same polarity as the epitaxy. In the diode region 140, the nanosheets 354 are wrapped around with a second epitaxy that has dopant polarity opposite to the dopant polarity of the nanosheets 354.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The corresponding structures, materials, acts, and equivalents of all means or step plus function elements in the claims below are intended to include any structure, material, or act for performing the function in combination with other claimed elements as specifically claimed. Embodiment of the present invention have been presented for purposes of illustration and description, but is not intended to be exhaustive or limited to the form described. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The terminology used herein is for describing particular embodiments only and is not intended to be limiting of embodiments of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While embodiments of the present invention have been described in detail in connection with only a limited number of embodiments, it should be readily understood that embodiments of the present invention are not limited to such described embodiments. Rather, embodiments of the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A semiconductor structure, comprising:
   a substrate having a field-effect transistor region and a diode region;
   a first stack comprising layers of a first material at the field-effect transistor region;
   a second stack comprising the layers of the first material alternating with layers of a second material at the diode region, the second material having a first dopant at the diode region, wherein the second material having the first dopant wraps around each of the layers of the first material at the diode region and the second material is directly below a bottommost layer of the layers of the first material at the diode region, wherein the first material at the diode region has a second dopant;

a third material having a third dopant at opposing sidewalls of the second stack, wherein a conductivity type of the first material having the second dopant is the same as a conductivity type of the third material having the third dopant, wherein a conductivity type of the second material having the first dopant is opposite to the conductivity type of the first material having the second dopant and the conductivity type of the third material having the third dopant; and a metalizing contact material over the substrate, wherein both the field-effect transistor region and the diode region include terminals.

2. The semiconductor structure of claim 1, further comprising a dielectric layer over the substrate.

3. The semiconductor structure of claim 2, wherein the dielectric layer is patterned to form trenches.

4. The semiconductor structure of claim 3, wherein the metalizing contact material fills the trenches.

5. The semiconductor structure of claim 1, wherein each of the layers of the first material comprises a nanosheet.

6. The semiconductor structure of claim 1, wherein each of the layers of the first material comprises a nanowire.

7. The semiconductor structure of claim 1, wherein the first material comprises silicon (Si).

8. The semiconductor structure of claim 1, wherein the substrate comprises a semiconductor-on-insulator (SOI) structure.

9. The semiconductor structure of claim 1, wherein the conductivity type of the second material having the first dopant comprises p-type and wherein each of the conductivity type of the first material having the second dopant and the conductivity type of the third material having the third dopant comprises n-type.

* * * * *